United States Patent
Choi et al.

(10) Patent No.: US 9,355,993 B2
(45) Date of Patent: May 31, 2016

(54) INTEGRATED CIRCUIT SYSTEM WITH DEBONDING ADHESIVE AND METHOD OF MANUFACTURE THEREOF

(71) Applicants: Won Kyoung Choi, Singapore (SG); Pandi Chelvam Marimuthu, Singapore (SG)

(72) Inventors: Won Kyoung Choi, Singapore (SG); Pandi Chelvam Marimuthu, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/791,287

(22) Filed: Jul. 3, 2015

(65) Prior Publication Data

US 2015/0311180 A1 Oct. 29, 2015

Related U.S. Application Data

(63) Continuation of application No. 14/038,275, filed on Sep. 26, 2013, now Pat. No. 9,076,724.

(51) Int. Cl.
| | |
|---|---|
| *H01L 21/00* | (2006.01) |
| *H01L 23/00* | (2006.01) |
| *H01L 21/683* | (2006.01) |
| *H01L 21/78* | (2006.01) |
| *H01L 23/48* | (2006.01) |
| *H01L 23/528* | (2006.01) |

(52) U.S. Cl.
CPC ............ *H01L 24/94* (2013.01); *H01L 21/6835* (2013.01); *H01L 21/6836* (2013.01); *H01L 21/78* (2013.01); *H01L 23/481* (2013.01); *H01L 23/528* (2013.01); *H01L 24/26* (2013.01); *H01L 24/27* (2013.01); *H01L 24/29* (2013.01); *H01L 24/83* (2013.01); *H01L 2221/68318* (2013.01); *H01L 2221/68327* (2013.01); *H01L 2221/68381* (2013.01); *H01L 2224/0401* (2013.01); *H01L 2224/0557* (2013.01); *H01L 2224/06181* (2013.01); *H01L 2224/13144* (2013.01); *H01L 2224/13147* (2013.01); *H01L 2224/27848* (2013.01); *H01L 2224/29187* (2013.01); *H01L 2224/8389* (2013.01); *H01L 2224/94* (2013.01); *H01L 2924/05432* (2013.01); *H01L 2924/05442* (2013.01); *H01L 2924/10253* (2013.01); *H01L 2924/14* (2013.01); *H01L 2924/20106* (2013.01)

(58) Field of Classification Search
USPC .......... 257/774, 737, 433, 777; 438/113, 462, 438/618, 66, 109, 127, 123, 15, 33, 613, 438/637, 669
See application file for complete search history.

(56) References Cited

U.S. PATENT DOCUMENTS

| | | | |
|---|---|---|---|
| 7,326,629 B2 | 2/2008 | Nagarajan et al. | |
| 7,790,509 B2 | 9/2010 | Gerber | |
| 7,863,104 B2 | 1/2011 | Kroeninger et al. | |
| 7,968,992 B2 | 6/2011 | Wang | |
| 8,039,304 B2 | 10/2011 | Pagaila | |
| 2009/0029504 A1 | 1/2009 | Paik et al. | |
| 2010/0067168 A1* | 3/2010 | Summers et al. | 361/301.3 |
| 2010/0308443 A1* | 12/2010 | Suthiwongsunthorn et al. | 257/621 |
| 2012/0074585 A1 | 3/2012 | Koo et al. | |
| 2012/0286404 A1 | 11/2012 | Pagaila | |

(Continued)

*Primary Examiner* — Dao H Nguyen
*Assistant Examiner* — Tram H Nguyen
(74) *Attorney, Agent, or Firm* — Ishimaru & Associates LLP

(57) ABSTRACT

A system and method of manufacture of an integrated circuit system includes: a die having a via, the die having a top side and a bottom side; a top interconnect mounted to the via at the top side; an interconnect pillar mounted to the via at the bottom side; a device interconnect mounted to the interconnect pillar; and a base adhesive covering the interconnect pillar and the device interconnect.

17 Claims, 4 Drawing Sheets

(56) References Cited

U.S. PATENT DOCUMENTS

| | | |
|---|---|---|
| 2013/0037936 A1 | 2/2013 | Choi et al. |
| 2013/0049229 A1 | 2/2013 | Su |
| 2013/0075924 A1 | 3/2013 | Lin et al. |
| 2013/0105989 A1 | 5/2013 | Pagaila et al. |
| 2013/0292850 A1 | 11/2013 | Chua et al. |
| 2014/0077364 A1 | 3/2014 | Marimuthu et al. |
| 2014/0267928 A1* | 9/2014 | Coban et al. ............... 348/731 |

* cited by examiner

INTEGRATED CIRCUIT SYSTEM WITH DEBONDING ADHESIVE AND METHOD OF MANUFACTURE THEREOF

CROSS-REFERENCE TO RELATED APPLICATION(S)

This is a continuation of U.S. patent application Ser. No. 14/038,275 filed Sep. 26, 2013, now U.S. Pat. No. 9,076,724.

TECHNICAL FIELD

The present invention relates generally to an integrated circuit system, and more particularly to a system with a debonding adhesive.

BACKGROUND ART

The integrated circuit is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit devices work and communicate with other circuitry of other integrated circuit devices using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented can determine the packaging size, packaging methods, and the individual packaging designs. Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system for improved yield, thermal cooling, low profile, and improved reliability. In view of the ever-increasing commercial competitive pressures, along with growing consumer expectations and the diminishing opportunities for meaningful product differentiation in the marketplace, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system, including: providing a wafer having a via, the wafer having a top side and a bottom side; mounting a top interconnect to the via at the top side; mounting an interconnect pillar to the via at the bottom side; attaching a device interconnect to the interconnect pillar; forming a base adhesive covering the interconnect pillar and the device interconnect; and forming a die by singulating the wafer.

The present invention provides an integrated circuit system including: a die having a via, the die having a top side and a bottom side; a top interconnect mounted to the via at the top side; an interconnect pillar mounted to the via at the bottom side; a device interconnect mounted to the interconnect pillar; and a base adhesive covering the interconnect pillar and the device interconnect.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
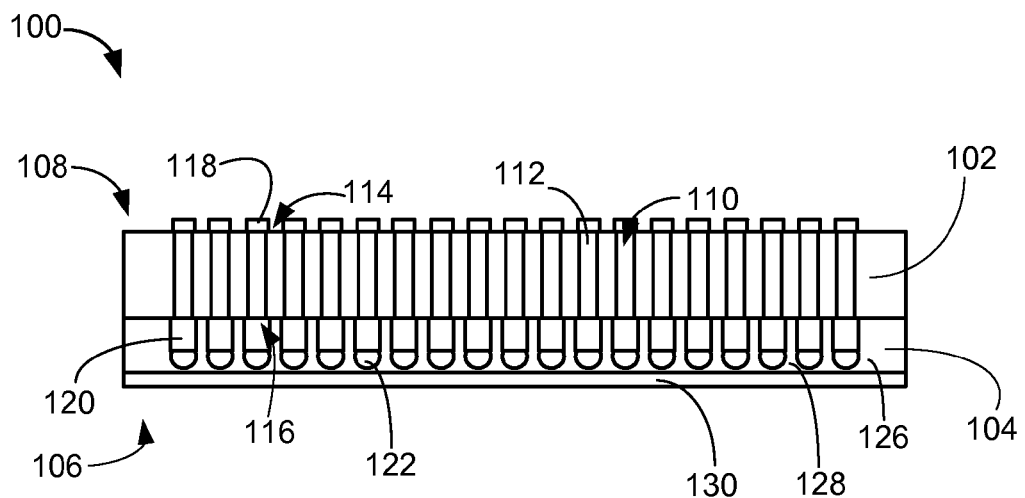
FIG. 1 is a cross-sectional view of an integrated circuit system 100 taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

The same numbers are used in all the drawing FIGS. to relate to the same elements. The embodiments have been numbered first embodiment, second embodiment, etc. as a matter of descriptive convenience and are not intended to have any other significance or provide limitations for the present invention.

The term "processing" as used herein includes deposition of material or photoresist, patterning, exposure, development, etching, cleaning, and/or removal of the material or photoresist as required in forming a described structure. The term "active side" refers to a side of a die, a module, a package, or an electronic structure having active circuitry fabricated thereon or having elements for connection to the active circuitry within the die, the module, the package, or the electronic structure.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means there is direct physical contact between elements. The term "directly on" means there is direct physical contact between elements with no intervening elements.

Figure 2:
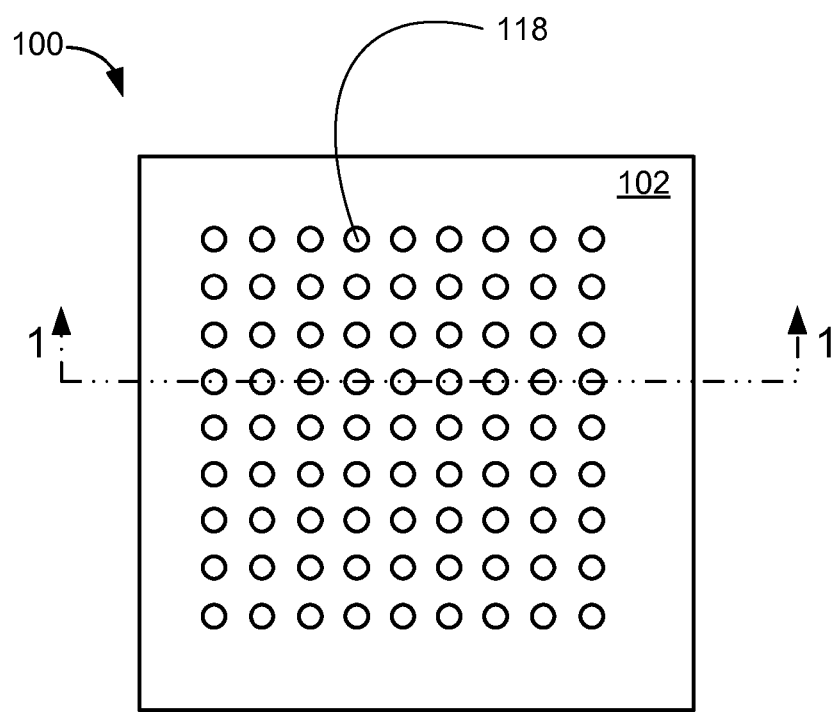
FIG. 2 is a top view of the integrated circuit system.

Referring now to FIG. 1, therein is shown a cross-sectional view of an integrated circuit system 100 taken along line 1-1 of FIG. 2 in a first embodiment of the present invention. The integrated circuit system 100 can include a die 102, a base adhesive 104, and interconnects.

The die 102 is defined as a semiconductor device. For example, the die 102 can include one or more integrated transistors for implementing active circuitry. The die 102 can also include interconnects, passive devices, or a combination thereof. Further for example, the die 102 can be an interposer.

The die 102 can include the materials of silicon, gallium, or other semiconducting material in the body of the die 102, as examples. The die 102 can have a vertical height equal to or less than 100 micrometers (μm). The die 102 can include a bottom side 106 and a top side 108 opposite to the bottom side 106.

The die 102 can include a via 110, such as a through silicon via (TSV). For example, the via 110 can be a conductive channel etched through a substrate from the top side 108 to the bottom side 106. The via 110 is exposed at the top side 108 and the bottom side 106 of the body of the die 102.

The via 110 can include a through conductor 112. The through conductor 112 is defined as a conductive element that spans the height of the via 110 from the top side 108 to the bottom side 106. The through conductor 112 can include conductive elements such as copper, gold, or conductive alloys as examples.

The via 110 can also include a via top surface 114 and a via bottom surface 116 opposite to the via top surface 114. Other interconnects can be mounted directly to the via top surface 114 and the via bottom surface 116 for providing a vertical or "z-type" electrical connection between the top side 108 and the bottom side 106. The diameter of the via 110 can be equal to or less than 15 μm and the vertical height of the via 110 can be less than 100 μm measured from the bottom side 106 to the top side 108.

The integrated circuit system 100 can include a top interconnect 118 attached to the via top surface 114. The top interconnect 118 is a conductive element such as copper, gold, or semiconducting alloy, as examples. The top interconnect 118 can provide a cap for the via 110 and expand the surface area that can be used for mounting other components.

The integrated circuit system 100 can include an interconnect pillar 120 and a device interconnect 122. The interconnect pillar 120 is a conductive element directly attached to the via bottom surface 116. The interconnect pillar 120 can also include a column, a post, or a stud as examples. The interconnect pillar 120 can include conductive material such as copper, gold, and conductive alloys as examples.

The interconnect pillar 120 can provide for a fine pitch between the via 110 and another of the via 110 because the interconnect pillar 120 provides an alternative and larger mounting surface for attaching solder. The interconnect pillar 120 also prevents solder bump bridge between the via 110 and another of the via 110.

The device interconnect 122 provides an electrical connection and can include a solder ball, a solder bump, or a solder joint as examples. The device interconnect 122 provides electrical connectivity between the die 102 and external components (not shown).

The base adhesive 104 is a non-conductive adhesive (NCA). The base adhesive 104 can enclose or cover the interconnect pillar 120, the device interconnect 122, and the bottom side 106 of the die 102. The top surface of the interconnect pillar 120 is exposed from the base adhesive 104. The base adhesive 104 can cover the interconnect pillar 120 except for a top surface of the interconnect pillar 120 that is directly attached to the via 110.

The base adhesive 104 also encapsulates the device interconnect 122 and is in direct connect with all surfaces of the device interconnect 122 except for the surface of the device interconnect 122 directly attached to the interconnect pillar 120. The base adhesive 104 can be coplanar to the die 102, the via bottom surface 116, and the top surface of the interconnect pillar 120.

The base adhesive 104 can include a non-conductive resin, a non-conductive paste (NCP), a non-conductive film (NCF), or a combination thereof. The base adhesive 104, preferably, can have a B-stage that is stable up to 200 degree Celsius for at least 20 minutes. The base adhesive 104 can include an inorganic filler material 126, an organic filler material 128, or a combination thereof. The inorganic filler material 126 can include silicon dioxide, aluminum oxide, or a combination thereof.

If the base adhesive 104 is a non-conductive paste, the B-stage can be formed by UV light or a low temperature cure of less than 100 degrees Celsius. If the base adhesive 104 is a NCA resin, the base adhesive 104 can be directly bonded to a Light-To-Heat-Conversion (LTHC) glass carrier. The base adhesive 104, such as a NCA resin can be separated or debonded from the LTHC glass carrier using UV light.

The base adhesive 104, as a non-conductive film, does not require the additional process of lamination. The base adhesive 104 also includes the properties of a viscosity that decreases from 200 degrees Celsius and a gelation point starting above 220 degrees Celsius.

The physical properties of the base adhesive 104 protect the die 102 from cracking and damaging during manufacturing and provide bonding and debonding applications. The base adhesive 104 can be used and reused in carrier-bonding and during thermocompression bonding (TCB), which reduces separate adhesive material costs and eliminates residue due to peeling.

It has been found that the inorganic filler material 126, of silicon dioxide and/or aluminum oxide, and the organic filler material 128 can be used to adjust the mechanical and physical properties of the base adhesive 104 for adjusting viscosity. The adjustment of viscosity and other physical properties provides for increased material reliability, device reliability, and device protection during manufacture on the components of the integrated circuit system 100.

During a subsequent processing steps, the integrated circuit system 100 can undergo flip-chip (FC) bonding and curing. After a FC bonding and curing process, the base adhesive 104 includes a decomposition temperature below 250 degrees Celsius and a glass transition temperature (Tg) greater than 150 degrees Celsius. The mechanical properties of the base adhesive 104 match the other components of the integrated circuit system 100 for reliability.

The integrated circuit system 100 can include a release adhesive 130 attached to the bottom surface of the base adhesive 104. The release adhesive 130 can include a UV light removable adhesive that is removed in subsequent manufacturing steps. The release adhesive 130 can be optional based on the materials used for the base adhesive 104.

If the base adhesive 104 is a NCF resin, the base adhesive 104 can form a bilayer structure with the release adhesive 130. The base adhesive 104 and the release adhesive 130 can be bonded and debonded to a glass carrier. Temporary bonding and debonding (TBDB) can be performed by laser, temperature, or a chemical process on the glass carrier.

It has been discovered that the base adhesive 104 provides a two in one non-conductive adhesive for carrier bonding, carrier debonding, and die attachment in a middle end of line (MEoL) process or a back end of line (BEoL) process. For example, the base adhesive 104, in a single application, can be used in each of the processes of carrier bonding, carrier debonding, and thermocompression bonding for die attachment without the need for costly additional adhesives and extra bonding manufacturing steps.

It has been discovered that the die 102 uses the base adhesive 104 for protection and bonding because the fine pitches and small gaps between the interconnect pillar 120 prevent the use of capillary underfill. For example, the base adhesive 104 with a B-stage stable to up to 200 degrees Celsius provides for protection of the bottom side 106 of the die 102 and a reusable adhesive for bonding and debonding from a carrier.

It has been found that the protection provided by the base adhesive 104 provides for the wafer of the die 102 to be thinner than 100 μm, which decreases package profile and improves yield and electrical connectivity in 2.5 D and 3 D integrated circuit devices. For example, the base adhesive 104 provides structural protection and support to the die 102 and prevents cracking during the manufacturing process.

It has been found that the via 110, the interconnect pillar 120, and the device interconnect 122 provide for finer or small pitch between the via 110 and another of the via 110 for reducing device size and preventing bump bridge between vias. For example, the device interconnect 122 is mounted to the interconnect pillar 120, which provides a larger mounting surface for solder and isolates the via 110 from solder bump bridge.

Referring now to FIG. 2, therein is shown a top view of the integrated circuit system 100. The top view includes the top interconnect 118 exposed from the body of the die 102. For illustrative purposes, the integrated circuit system 100 is shown having a nine by nine array of the top interconnect 118 although it is understood that the integrated circuit system 100 can have a different configuration. For example, the integrated circuit system 100 can include an array of sixteen by sixteen or ten by ten depending on the design and requirements of the system.

Further for illustrative purposes, the top interconnect 118 is shown having a top surface in the shape of a circle although it is understood that the top surface of the top interconnect 118 can be formed in different shapes. For example, the top interconnect 118 can have a shape of a square, rectangle, oval, or polygon depending on the design and requirements of the system.

Figure 3:
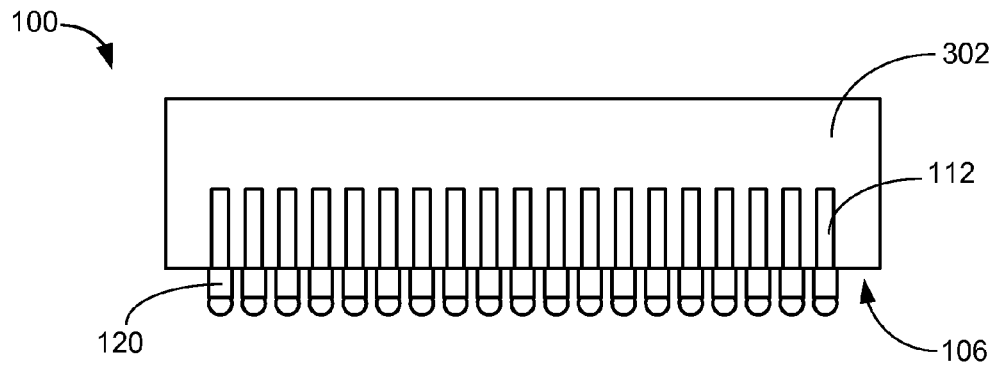
FIG. 3 a cross-sectional view of the integrated circuit system of FIG. 1 in a bumping phase of manufacture.

Referring now to FIG. 3, therein is shown a cross-sectional view of the integrated circuit system 100 of FIG. 1 in a bumping phase of manufacture. A wafer 302 is provided. The wafer 302 can include the through conductor 112 embedded in the body of the wafer 302.

The body of the wafer 302 can cover the top of the through conductor 112. The through conductor 112 can be exposed from the bottom side 106. In subsequent manufacturing steps, the wafer 302 can be processed to form the via 110 of FIG. 1.

The interconnect pillar 120 is mounted directly to the through conductor 112 at the bottom side 106. The device interconnect 122 is attached or mounted directly to a bottom surface of the interconnect pillar 120.

Figure 4:
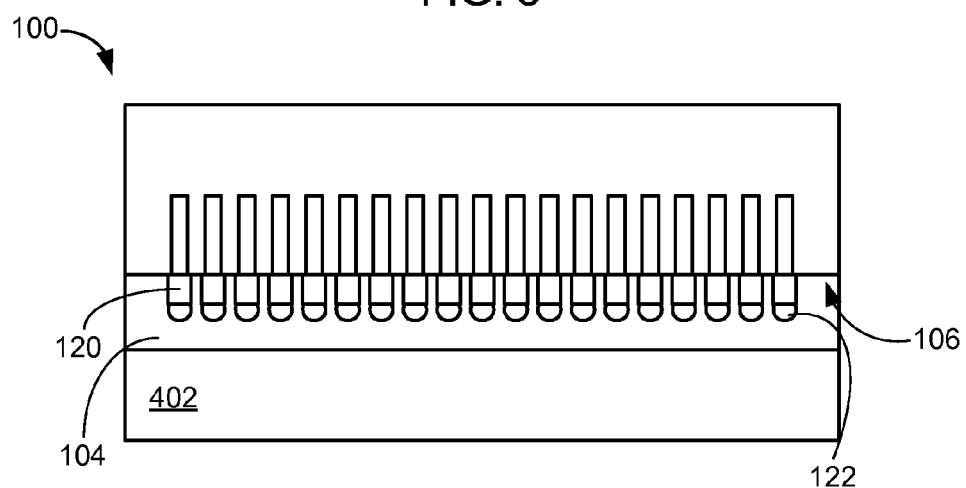
FIG. 4 is the structure of FIG. 3 in an adhesive coating phase of manufacture.

Referring now to FIG. 4, therein is shown the structure of FIG. 3 in an adhesive coating phase of manufacture. The base adhesive 104 is applied for coating the interconnect pillar 120, the device interconnect 122, and the bottom side 106 of the die 102.

The base adhesive 104 is bonded to a carrier 402. The carrier 402 can include a glass carrier or a Light-to-Heat-Conversion (LTHC) glass carrier, as examples. The release adhesive 130 of FIG. 1 can also be bonded to the carrier 402, with the release adhesive 130 between the base adhesive 104 and the carrier 402.

Further for example, if the base adhesive 104 is a NCA resin, the base adhesive 104 can be directly bonded to the carrier 302, such as a Light-To-Heat-Conversion (LTHC) glass carrier. The base adhesive 104, such as a NCA resin can be separated or debonded from the LTHC glass carrier using UV light.

Figure 5:
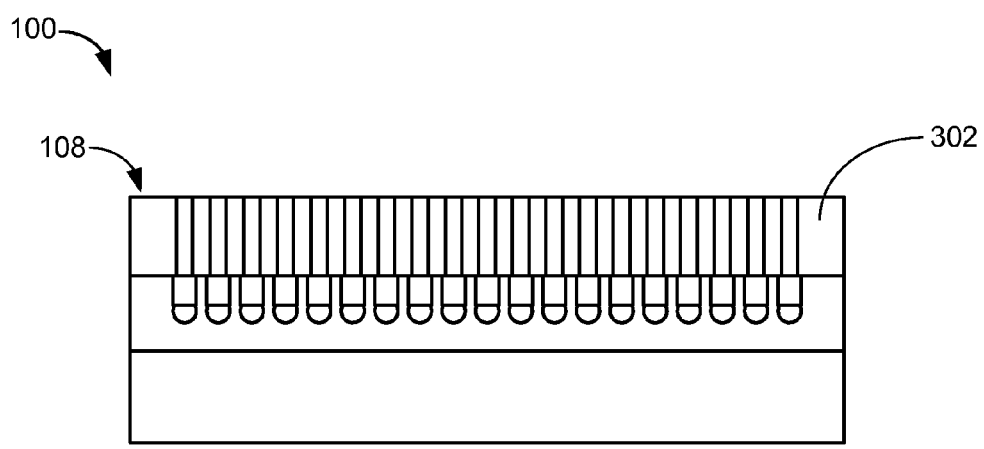
FIG. 5 is the structure of FIG. 4 in a wafer-thinning phase of manufacture.

Referring now to FIG. 5, therein is shown the structure of FIG. 4 in a wafer-thinning phase of manufacture. The wafer 302 is thinned at the top side 108. The thinning process can include back grinding (BG) or chemical mechanical polishing (CMP) as examples. The thinning process forms the via 110 of FIG. 1 and reduces the profile of the wafer 302.

Figure 6:
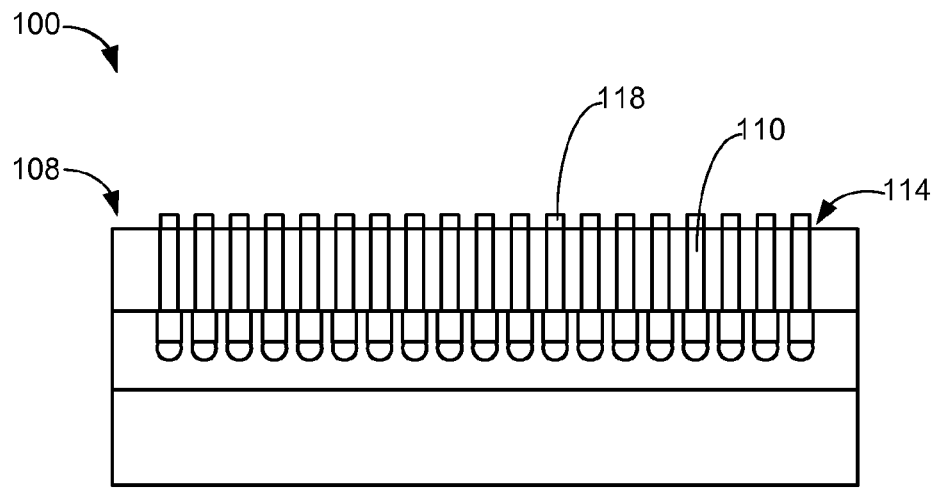
FIG. 6 is the structure of FIG. 5 in a top attachment phase of manufacture.

Referring now to FIG. 6, therein is shown the structure of FIG. 5 in a top attachment phase of manufacture. After the wafer thinning phase, the via top surface 114 is exposed from the top side 108. The top interconnect 118 is attached or directly mounted to the via top surface 114 of the via 110.

Figure 7:
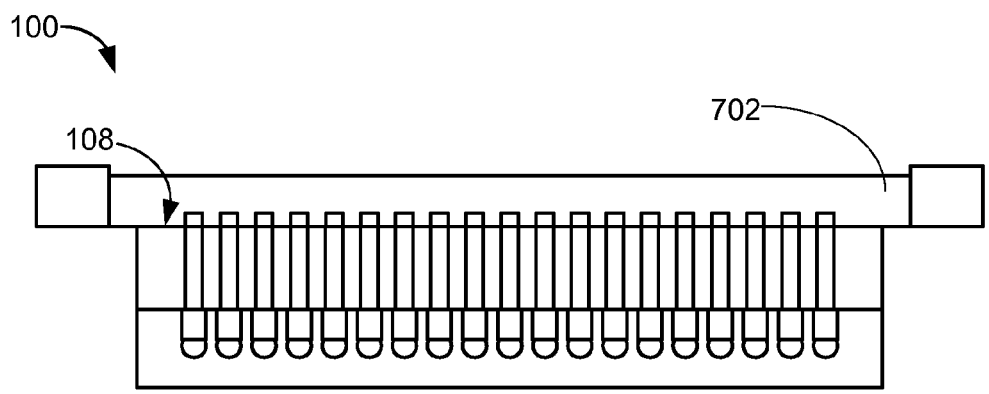
FIG. 7 is the structure of FIG. 6 in a carrier-debonding phase of manufacture.

Referring now to FIG. 7, therein is shown the structure of FIG. 6 in a carrier-debonding phase of manufacture. The carrier 402 of FIG. 4 is removed by debonding through UV light, laser, temperature, chemical process, or a combination thereof. A pickup carrier 702 can be attached to the top side 108 and cover the top interconnect 118. The pickup carrier 702 can include a self-healing adhesive or epoxy that reverts to an original shape after singulation.

Figure 8:
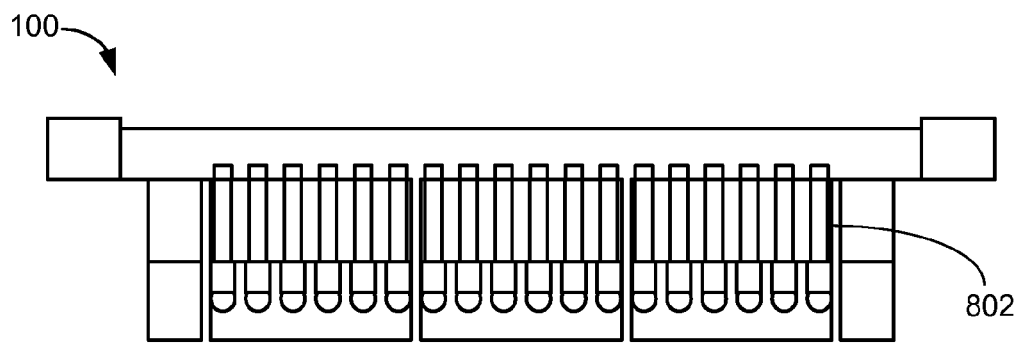
FIG. 8 is the structure of FIG. 7 in a wafer-singulation phase of manufacture.

Referring now to FIG. 8, therein is shown the structure of FIG. 7 in a wafer-singulation phase of manufacture. The wafer 302 of FIG. 3 is singulated to form the die 102 of FIG. 1. The singulation process can include a blade, saw, or laser, as examples. The die 102 can include a sidewall 802 having destructive marks, scratches, marks, indentations, saw marks, and burns characteristic of a singulation process.

Figure 9:
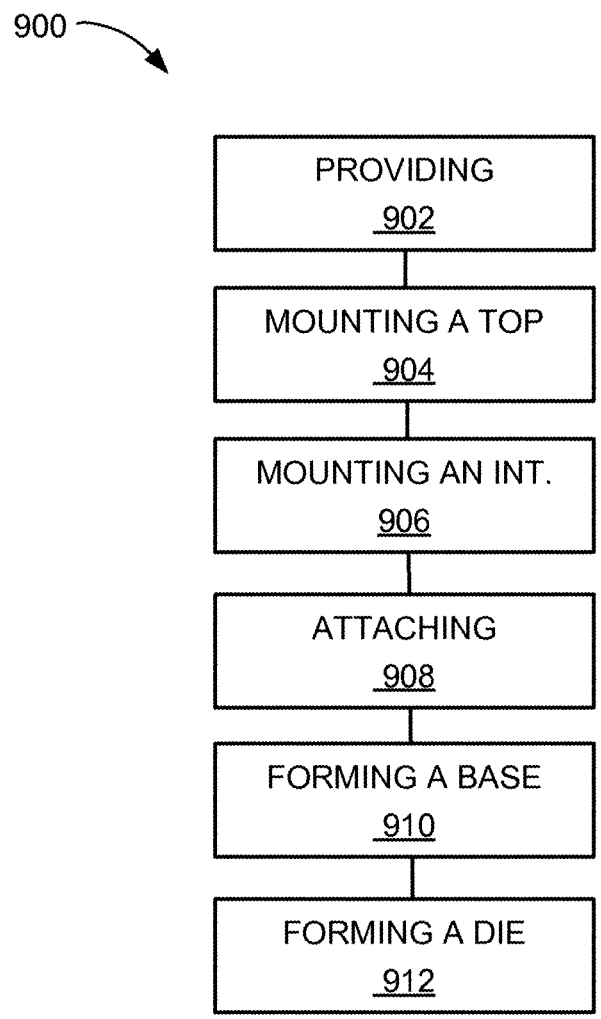
FIG. 9 is a flow chart of a method of manufacture of the integrated circuit system in a further embodiment of the present invention.

Referring now to FIG. 9, therein is shown a flow chart of a method 900 of manufacture of the integrated circuit system in a further embodiment of the present invention. The method 900 includes: providing a wafer having a via, the wafer having a top side and a bottom side in a block 902; mounting a top interconnect to the via at the top side in a block 904; mounting an interconnect pillar to the via at the bottom side in a block 906; attaching a device interconnect to the interconnect pillar in a block 908; forming a base adhesive covering the interconnect pillar and the device interconnect in a block 910; and forming a die by singulating the wafer in a block 912.

Thus, it has been discovered that the integrated circuit system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a wafer having a via, the wafer having a top side and a bottom side;
   mounting a top interconnect to the via at the top side;
   mounting an interconnect pillar to the via at the bottom side;
   attaching a device interconnect to the interconnect pillar;
   forming a base adhesive covering the interconnect pillar and the device interconnect includes forming the base adhesive having a gelation point of 220 degrees Celsius; and
   forming a die by singulating the wafer.

2. The method as claimed in claim 1 further comprising mounting a release adhesive to the base adhesive.

3. The method as claimed in claim 1 wherein forming the base adhesive includes forming the base adhesive having an inorganic filler material and an organic filler material.

4. The method as claimed in claim 1 wherein mounting the interconnect pillar includes mounting the interconnect pillar with a width greater than the width of the via.

5. A method of manufacture of an integrated circuit system comprising:
   providing a wafer having a through-silicon via, the wafer having a top side and a bottom side;
   mounting a top interconnect to the through-silicon via at the top side;
   mounting an interconnect pillar to the through-silicon via at the bottom side;
   attaching a device interconnect to the interconnect pillar;
   forming a base adhesive covering the interconnect pillar and the device interconnect includes the base adhesive of silicon dioxide; and
   forming a die by singulating the wafer.

6. The method as claimed in claim 5 wherein forming the base adhesive includes forming the base adhesive having a non-conductive paste resin having a curing temperature below 100 degrees Celsius.

7. The method as claimed in claim 5 wherein:
   forming the base adhesive includes forming a non-conductive film resin covering the interconnect pillar and the device interconnect; and
further comprising:
   mounting a release adhesive directly attached to the non-conductive film resin.

8. The method as claimed in claim 5 wherein forming the base adhesive includes the base adhesive of aluminum oxide.

9. An integrated circuit system comprising:
   a die having a via, the die having a top side and a bottom side;
   a top interconnect mounted to the via at the top side;
   an interconnect pillar mounted to the via at the bottom side;
   a device interconnect mounted to the interconnect pillar; and
   a base adhesive, with a gelation point of 220 degrees Celsius, covering the interconnect pillar and the device interconnect.

10. The system as claimed in claim 9 further comprising a release adhesive mounted to the base adhesive.

11. The system as claimed in claim 9 wherein the base adhesive includes an inorganic filler material and an organic filler material.

12. The system as claimed in claim 9 wherein a width of the interconnect pillar is greater than the width of the via.

13. The system as claimed in claim 9 wherein the via is a through-silicon via.

14. The system as claimed in claim 13 wherein the base adhesive is a non-conductive paste resin having a curing temperature below 100 degrees Celsius.

15. The system as claimed in claim 13 wherein:
   the base adhesive is a non-conductive film resin; and
further comprising:
   a release adhesive directly attached to the non-conductive film resin.

16. The system as claimed in claim 13 wherein the base adhesive includes silicon dioxide.

17. The system as claimed in claim 13 wherein the base adhesive includes aluminum oxide.

* * * * *